(12) United States Patent
Jang et al.

(10) Patent No.: US 6,401,001 B1
(45) Date of Patent: Jun. 4, 2002

(54) LAYER MANUFACTURING USING DEPOSITION OF FUSED DROPLETS

(75) Inventors: Bor Z. Jang; Junsheng Yang; Junhai Liu; Lijun Pan, all of Auburn, AL (US)

(73) Assignee: Nanotek Instruments, Inc., Opelika, AL (US)

( * ) Notice: Subject to any disclaimer, the term of this patent is extended or adjusted under 35 U.S.C. 154(b) by 0 days.

(21) Appl. No.: 09/358,871

(22) Filed: Jul. 22, 1999

(51) Int. Cl.$^7$ .............................................. G06F 19/00
(52) U.S. Cl. ................... 700/118; 700/98; 700/119; 700/120; 700/163; 264/401; 264/512; 264/516; 427/466; 427/470; 427/472; 204/192.15; 204/192.2; 204/298.12
(58) Field of Search ............................. 700/97, 98, 117, 700/118, 119–120, 163; 345/419, 420; 264/9, 407, 512–516, 633, 642, 75, 308, 317; 427/466, 472, 470, 249.14, 248.1, 255.4, 595, 553; 204/192.15, 192.2–192.26, 192.3, 298.12

(56) References Cited

U.S. PATENT DOCUMENTS

| | | |
|---|---|---|
| 4,615,904 A | 10/1986 | Ehrlich et al. |
| 4,665,492 A | 5/1987 | Masters |
| 4,863,538 A | 9/1989 | Deckard |
| 4,944,817 A | 7/1990 | Bourell et al. |
| 5,017,317 A | 5/1991 | Marcus |
| 5,059,266 A | 10/1991 | Yamane et al. |
| 5,135,695 A | 8/1992 | Marcus |
| 5,136,515 A | 8/1992 | Helinski |
| 5,140,937 A | 8/1992 | Yamane et al. |
| 5,169,579 A | 12/1992 | Marcus et al. |
| 5,171,360 A | 12/1992 | Orme et al. |
| 5,216,616 A | 6/1993 | Masters |
| 5,226,948 A | 7/1993 | Orme et al. |
| 5,257,657 A | 11/1993 | Gore |
| 5,259,593 A | 11/1993 | Orme et al. |
| 5,301,863 A | 4/1994 | Priz et al. |
| 5,306,447 A | 4/1994 | Marcus et al. |
| 5,340,090 A | 8/1994 | Orme et al. |
| 5,555,176 A | 9/1996 | Menhennett et al. |
| 5,611,883 A | 3/1997 | Thompkins et al. |
| 5,617,911 A | 4/1997 | Sterett et al. |
| 5,637,175 A * | 6/1997 | Feygin et al. ................ 156/264 |
| 5,669,433 A * | 9/1997 | Sterett et al. ................. 164/46 |
| 5,718,951 A | 2/1998 | Sterett et al. |
| 5,738,817 A * | 4/1998 | Danforth et al. ............ 264/603 |
| 5,746,844 A | 5/1998 | Sterett et al. |
| 5,814,265 A * | 9/1998 | Hull ........................... 264/401 |
| 5,879,489 A * | 3/1999 | Burns et al. .................. 156/64 |
| 5,934,343 A * | 8/1999 | Gaylo et al. ................. 141/12 |
| 6,129,872 A * | 10/2000 | Jang ........................... 264/75 |
| 6,165,406 A * | 12/2000 | Jang et al. .................. 264/308 |
| 6,214,279 B1 * | 4/2001 | Yang et al. .................. 264/482 |
| 6,243,616 B1 * | 6/2001 | Droscher et al. ........... 700/118 |

* cited by examiner

Primary Examiner—Ramesh Patel

(57) ABSTRACT

A solid freeform fabrication process and apparatus for making a three-dimensional object. The process comprises the steps of (1) positioning a material deposition sub-system a selected distance from a target surface, (2) operating this sub-system to deposit materials onto the target surface by carrying out the sub-steps of (a) operating a multiple-channel powder delivery device for supplying selected powder compositions at a predetermined flow rate to travel toward the target surface and (b) operating a focused energy beam to produce a fusion zone through which the powder particles, preferably in micron or nanometer sizes, are melted while in flight, thereby producing liquid droplets traveling to deposit onto the target surface, and (3) during the material deposition process, moving the deposition sub-system and the target surface relative to one another along selected directions in a plane defined by first and second coordinate directions and in a third direction orthogonal to this plane to form deposition materials into a three dimensional shape. These steps are preferably executed under the control of a computer system. Preferably, the system is also operated to generate a support structure for any un-supported feature of the object.

35 Claims, 7 Drawing Sheets

LAYER MANUFACTURING USING DEPOSITION OF FUSED DROPLETS

FIELD OF THE INVENTION

This invention relates generally to a computer-controlled object-building system and, in particular, to an improved layer manufacturing system for building a three-dimensional object such as a model, molding tool, microelectronic device and micro-electromechanical system (MEMS) using the deposition of fused droplets.

BACKGROUND OF THE INVENTION

Solid freeform fabrication (SFF) or layer manufacturing is a new rapid prototyping and manufacturing technology. In its most commonly used approach, a SFF system builds an object layer by layer or point by point under the control of a computer. The process begins with creating a Computer Aided Design (CAD) file to represent the geometry of a desired object. This CAD file is converted to a suitable format, e.g. stereo lithography (.STL) format, and further sliced into a large number of thin layers with the contours of each layer being defined by a plurality of line segments connected to form vectors or polylines. The layer data are converted to tool path data normally in terms of computer numerical control (CNC) codes such as G-codes and M-codes. These codes are then utilized to drive a fabrication tool for building an object layer by layer.

The SFF technology has found a broad range of applications such as verifying CAD database, evaluating design feasibility, testing part functionality, assessing aesthetics, checking ergonomics of design, aiding in tool and fixture design, creating conceptual models and sales/marketing tools, generating patterns for investment casting, reducing or eliminating engineering changes in production, and providing small production runs. Although most of the prior-art SFF techniques are capable of making 3-D form models on a macroscopic scale, few are able to directly produce a microelectronic device or micro-electromechanical system (MEMS) that contains micron- or nano-scale functional elements.

In U.S. Pat. No. 4,665,492, issued May 12, 1987, Masters teaches part fabrication by spraying liquid resin droplets, a process commonly referred to as Ballistic Particle Modeling (BPM). The BPM process includes heating a supply of thermoplastic resin to above its melting point and pumping the liquid resin to a nozzle, which ejects small liquid droplets from different directions to deposit on a substrate. Patents related to the BPM technology can also be found in U.S. Pat. No. 5,216,616 (June 1993 to Masters), U.S. Pat. No. 5,555,176 (September 1996, Menhennett, et al.), and U.S. Pat. No. 5,257,657 (November 1993 to Gore). Sanders Prototype, Inc. (Merrimack, N.H.) provides inkjet print-head technology for making plastic or wax models. Multiple-inkjet based rapid prototyping systems for making wax or plastic models are available from 3D Systems, Inc. (Valencia, Calif.). Model making from curable resins using an inkjet print-head is disclosed by Yamane, et al. (U.S. Pat. No. 5,059,266, October 1991 and U.S. Pat. No. 5,140,937, August 1992) and by Helinski (U.S. Pat. No. 5,136,515, August 1992). Inkjet printing involves ejecting fine polymer or wax droplets from a print-head nozzle that is either thermally activated or piezo-electrically activated. The droplet size typically lies between 30 and 100 $\mu$m, but could go down to 13 $\mu$m. This implies that inkjet printing offers a part accuracy on the order of 13 $\mu$m or worse which, for the most part, is not adequate for the fabrication of microelectronic devices.

Methods that involve deposition of metal parts from a steam of liquid metal droplets are disclosed in Orme, et al (U.S. Pat. Nos. 5,171,360; 5,226,948; 5,259,593; 5,340,090) and in Sterett, et al. (U.S. Pat. Nos. 5,617,911; 5,669,433; 5,718,951; 5,746,844). The method of Orme, et al involves directing a stream of a liquid material onto a collector of the shape of the desired product. A time dependent modulated disturbance is applied to the stream to produce a liquid droplet stream with the droplets impinging upon the collector and solidifying into a unitary shape. The method of Sterett, et al entails providing a supply of liquid metal droplets with each droplet being endowed with a positive or negative charge. The steam of liquid droplets is focused by passing these charged droplets through an alignment means, e.g., an electric field, to deposit on a target in a predetermined pattern.

The above-cited prior art droplet deposition methods suffer from the following drawbacks:

(1) Inkjet print-head based systems have been largely limited to ejection and deposition of polymer droplets with very low melting temperature (Tm) or glass transition temperature (Tg) such as wax, high impact polystyrene (HIPS), and acrylonitrile-butadiene-styrene copolymer (ABS). These materials can only be used to make models for form and fit, but not functional parts. Even with these low melting materials, the droplet sizes have been known to be larger than 13 $\mu$m (normally 50 $\mu$m or larger). When being jetted through an inkjet orifice, the liquid droplets could not go down to a few microns or sub-micron in scale due to the strong viscosity and surface tension effects.

(2) The ejection of metallic or ceramic liquid droplets is expected to be difficult due to the high melting temperatures of these materials. The piezoelectric elements such as lead-zirconate-titanate (PZT) commonly used as an actuator to drive and expel liquid droplets are known to have limited working temperature ranges. They are not particularly suitable for use in a high temperature environment conducive to ejection of metallic or ceramic liquid droplets.

(3) The methods proposed by Orme, et al (e.g., U.S. Pat. No. 5,171,360) and by Sterett, et al. (e.g., U.S. Pat. No. 5,617,911) require a continuous supply of liquid metal droplets. The raw metallic material, normally in bulk quantity in the melt state, has to be maintained in a high temperature for an extended period of time, thereby subject to oxidation. Further, since the supply of liquid droplets is essentially continuous rather than drop-on-demand, it is difficult to prevent droplets from reaching "negative" regions (which are not portions of a cross-section of the object). A mask will have to be used to collect these un-desired droplets. In both cases, the metal droplets are on the micron scale or larger.

(4) Similarly, in any layer manufacturing method that involves thermal spray (e.g., U.S. Pat. No. 5,301,863), a mask has to be used to screen out undesired droplets.

In U.S. Pat. No. 5,301,863 issued on Apr. 12, 1994, Prinz and Weiss disclose a Shape Deposition Manufacturing (SDM) system. The system contains a material deposition station and a plurality of processing stations (for mask making, heat treating, packaging, complementary material deposition, shot peening, cleaning, shaping, sand-blasting, and inspection). Each processing station performs a separate function such that when the functions are performed in series, a layer of an object is produced and is prepared for the deposition of the next layer. This system requires an article transfer apparatus, a robot arm, to repetitively move the object-supporting platform and any layers formed thereon out of the deposition station into one or more of the processing stations before returning to the deposition station for building the next layer. These additional operations in the processing stations tend to shift the relative position of the object with respect to the object platform. Further, the transfer apparatus may not precisely bring the object to its exact previous position. Hence, the subsequent layer may be deposited on an incorrect spot, thereby compromising part accuracy. The more processing stations that the growing object has to go through, the higher the chances are for the part accuracy to be lost. Such a complex and complicated process necessarily makes the over-all fabrication equipment bulky, heavy, expensive, and difficult to maintain. The equipment also requires attended operation.

The selected laser sintering or SLS technique (e.g., U.S. Pat. No. 4,863,538 issued in September 1989 to Deckard and U.S. Pat. No. 4,944,817 issued July 1990 to Bourell, et al.) involves spreading a full-layer of powder particles and uses a computer-controlled, high-power laser to partially melt these particles at desired spots. Commonly used powders include thermoplastic particles or thermoplastic-coated metal and ceramic particles. The procedures are repeated for subsequent layers, one layer at a time, according to the CAD data of the sliced-part geometry.

In a series of U.S. Patents (U.S. Pat. No. 5,017,317 in May 1991; U.S. Pat. No. 5,135,695 in August 1992; U.S. Pat. No. 5,169,579 in December 1992; U.S. Pat. No. 5,306,447 in April 1994; U.S. Pat. No. 5,611,883 in March 1997), Marcus and co-workers have disclosed a selected area laser deposition (SALD) technique for selectively depositing a layer of material from a gas phase to produce a part composed of a plurality of deposited layers. The SALD apparatus includes a computer controlling and directing a laser beam into a chamber containing the gas phase. The laser causes decomposition of the gas phase and selectively deposits material within the boundaries of the desired cross-sectional regions of the part. A major advantage of this technique is that it is capable of depositing a wide variety of materials to form an object on a layer by layer basis. The prior art SALD technique, however, is subject to the following shortcomings:

(1) Just like most of the prior-art layer manufacturing techniques, the SALD technique is largely limited to producing parts with homogeneous material compositions. Although, in principle, SALD allows for variations in the material composition from layer to layer, these variations can not be easily accomplished with the prior art SALD apparatus. For instance, upon completion of depositing a layer, the remaining gas molecules must be evacuated out of the build chamber, which is then filled with a second gas phase composition. This would be a slow and tedious procedure.

(2) The prior art SALD technique does not readily permit variations in the material composition from spot to spot in a given layer. This is due to the fact that the chamber is filled with a gas phase of an essentially uniform composition during the formation of a specific layer. In other words, the laser beam only decomposes one specific gas composition, leading to the deposition of a uniform-composition layer. In many applications (e.g., "direct writing" or deposition of a microelectronic device) material compositions vary as a function of spatial locations.

(3) The prior art SALD technique has poor resolution, precision or accuracy. The deposition spot size could not be smaller than the laser beam spot size, which is normally quite large. It is difficult to produce micron or sub-micron scale deposition spots with prior art SALD.

In U.S. Pat. No. 4,615,904 issued in October 1986, Ehrlich, et al. disclose a method of growing patterned films on a substrate in a deposition chamber. The method consists of the following steps: (1) pressurizing the chamber with a fluid medium to form a thin absorption layer on the substrate, (2) evacuating the chamber to remove excess fluid medium, (3) pre-nucleating portions of the substrate with a focused energy beam, (4) re-pressurizing the chamber with a fluid medium, and (5) inducing deposition of material from the liquid medium. This method permits growth of a patterned film with deposition occurring primarily on the pre-nucleated portions of the substrate. This method suffers from substantially the same drawbacks as with SALD.

Therefore, an object of the present invention is to provide an improved layer-additive process and apparatus for producing an object with high part accuracy.

Another object of the present invention is to provide a computer-controlled process and apparatus for producing a multi-material 3-D object on a layer-by-layer basis.

Still another object of the present invention is to provide a computer-controlled process and apparatus capable of producing multiple-layer microelectronic devices and other functional parts.

It is another object of this invention to provide a process and apparatus for building a CAD-defined object in which the material composition distribution can be predetermined.

Still another object of this invention is to provide a layer manufacturing technique that places minimal constraint on the range of materials that can be used in the fabrication of a 3-D object.

SUMMARY OF THE INVENTION

The Process The objects of the present invention are realized by a process and apparatus for fabricating a three-dimensional (3-D) object on a layer-by-layer basis. In one preferred embodiment, the process comprises positioning a material deposition sub-system a selected distance from a target surface. The material deposition sub-system comprises a multi-channel solid powder delivery device, each channel having a small-sized orifice through which a desired material composition in fine powder form (preferably on a micron, submicron, or nanometer scale) can be dispensed at a predetermined flow rate. The flow of a fine powder from a discharge orifice toward a selected area of the target surface forms a powder travel path. The material deposition sub-system further comprises a focused energy beam, such as a laser beam. The energy beam and the powder travel path intersect each other to form a fusion zone in which a powder is melted-in-flight.

Specifically, a first powder material is dispensed and melted while traveling through a fusion zone. The liquid droplet is directed to strike a first focused area of a target surface and deposit a first volume of material on this first area. The process further comprises operating motion devices so that the target surface is moved relative to the material deposition sub-system in a direction on an X-Y plane defined by first (X-) direction and second (Y-) direction. During this movement operation, a second powder material, of the same or different composition, is dispensed and fused for depositing a second volume of material to a second focused area of the target surface. These procedures are repeated, preferably by using a CAD computer to control the relative movement between the target surface and the material deposition sub-system in selected directions on the X-Y plane, to trace out the cross-section of the first layer of the desired object. The material deposition sub-system is then shifted by a predetermined distance away from the target surface in a Z-direction, perpendicular to the X-Y plane. These X-Y-Z directions form a Cartesian coordinate system. These procedures are then repeated under the control of the CAD computer to deposit consecutive layers in sequence, with each subsequent layer adhering to a preceding layer, thereby forming the desired multiple-layer 3-D object.

Preferably, the above steps are attendant with additional steps of forming multiple layers of an inert material (e.g., an electrically insulating material for a multi-layer microelectronic device) on top of one another to form a support structure for an un-supported feature of an object such as an overhang or isolated island. A support structure may either occupy just a selected area of an individual layer or fully cover the remaining area of a layer otherwise unoccupied by the deposition materials. The deposition materials refer to those materials being fused-in-flight and allowed to deposit on a surface of a previous layer or the target surface. In each layer, the portions of an object occupied by the deposition materials are referred to as the "positive region" and the remaining unoccupied area is "negative region". The support material in the negative region can be deposited by using a separate material-dispensing tool such as an extrusion nozzle, inkjet printhead, or plasma sprayer.

Further preferably, the above cited steps are executed under the control of the CAD computer by taking the following specific procedures: (1) creating a geometry of the 3-D object on a computer with geometry including a plurality of segments defining the object; (2) generating programmed signals corresponding to each of the segments in a predetermined sequence; and (3) moving the deposition sub-system and the target surface relative to each other in response to the programmed signals. To build a multi-material object, each segment is preferably attached with a material composition code that can be converted to programmed signals for activating the deposition of selected material compositions to form a desired material distribution of the finished object. Further preferably, the supporting software programs in the computer comprise means for evaluating the CAD data files of the object to locate any un-supported feature of the object and means for defining a support structure for the un-supported feature. The software is also capable of creating a plurality of segments defining the support structure and generating programmed signals required by a deposition tool to fabricate the support structure.

This deposition tool for dispensing the support structure material may be a separate deposition tool such as an extrusion device, a thermal spray nozzle, or an inkjet printhead. This deposition tool may simply be the deposition sub-system used in building the desired object. In this case, a weaker material, a lower-melting material, or a weaker geometry configuration may be selected for building the support structure. This support structure can then be readily removed upon completion of a given layer or the complete object.

The energy beam power can be adjusted to just partially or completely melt the powder particles while traveling through the fusion zone. Essentially any type of solid powder material that is meltable can be used in this process. In an embodiment, a powder particle is composed of a solid core coated with another material composition that has a lower melting point. This lower melting surface coating more readily allows for partial melting of powder particles and mutual adhesion between particles once deposited.

The Apparatus

Another embodiment of this invention is an apparatus comprising a material deposition sub-system, a target surface, motion devices and associated machine controller/indexer, and a computer. The material deposition sub-system is composed of three major components: a multi-channel powder material delivery device, a focused energy beam (a laser beam, e.g.), and optionally a separate dispensing tool for depositing a support structure.

The powder delivery device comprises a multiplicity of flow channels. Each channel has at least two ends, first end being in flow communication with a source of powder particles and second end having a discharge orifice of a predetermined size for dispensing the powder particles. The powder compositions are such that they are readily fused while traveling through the energy beam. The fused droplets readily solidify and adhere to the target surface or a previous layer already deposited on the target surface. The delivery device also comprises valve or switch means located in control relation to these channels for regulating the flow of powder particles through these discharge orifices. The discharge orifices are preferably small in size, being micron or nanometer scaled as desired and consistent with powder particle sizes. Different channels may be supplied with different powder compositions so that one powder material or a mixture of powder material compositions at a time is discharged from selected orifices, fused by the laser beam, and directed to move toward the target surface for depositing a small amount of material on a target spot. This multi-channel arrangement readily allows for variations in the material composition so that the spatial distribution of materials in each layer can be predetermined and well controlled.

In one preferred embodiment, a flow channel may comprise a plurality of chambers separated by dynamic sieves; each sieve being a plate containing holes through which powders of selected sizes can filter through. The sieves are excited to vibrate for preventing agglomeration of particles and for facilitating the migration of fine particles through these holes. Optionally, air may be pumped into a chamber to "fluidize" the powder particles, i.e., making these solid particles undergoing constant moving inside the chamber. Preferably, a cascade of two or three chambers are stacked together with first chamber being supplied with powder particles continuously or intermittently. The second chamber, separated from the first by a dynamic sieve, will have fewer particles. The third chamber, separated from the second chamber by a second sieve or valve, is allowed to have a predetermined number of particles at a time. The last of this cascade of chambers is equipped with a particle counting device (e.g., comprising a low-power laser beam and a photo detector) for counting the number of particles inside this chamber. This information is then preferably fed back to a controller for activating the dynamic sieves to replenish the chamber with powder particles. Powder particles may be provided with charges (e.g., negative charges) and the last chamber is provided with an electrode (e.g., positively charged) to direct and/or accelerate the discharge of the powder particles. This chamber assembly makes it possible to provide a few particles (down to a single particle if so desired) at a time through the orifice. This feature now makes it possible to deposit ultra-small domains of selected functional materials in individual layers.

The focused energy beam, preferably comprising a laser beam, is disposed in working proximity to the target surface, creating a small fusion zone proximate the target surface where the powder is melted, partially or completely. The fused droplets are directed to strike the target surface and readily solidify thereon.

The target surface is generally flat and is located in close, working proximity to the discharge orifices of the deposition sub-system to receive discharged powder materials therefrom. The motion devices are coupled to the target surface and the material deposition sub-system for moving the deposition sub-system and the target surface relative to one another in the X-Y plane and in the Z-direction. If necessary, the powder delivery device and the laser beam may be attached together to move congruently or as an integral unit. Preferably, however, this material deposition sub-system, comprising the powder delivery device plus the laser beam, is allowed to remain stationary while the target surface is controlled to move in the X-Y-Z directions. The motion devices are preferably controlled by a computer system for positioning the deposition sub-system with respect to the target surface in accordance with a CAD-generated data file representing the object. Further preferably, the same computer is used to regulate the operations of the material deposition sub-system in such a fashion that materials of predetermined compositions at predetermined proportions are dispensed in predetermined sequences.

The target surface may be provided with a controlled atmosphere wherein the temperature, pressure (including vacuum conditions), and gas composition can be regulated to facilitate deposition and to protect against possible metal oxidation. Preferably, sensor means are provided to periodically measure the dimensions of an object being built and send the acquired dimension data to the CAD computer so that new sets of logical layers may be re-calculated when necessary.

Advantages of the invention

The process and apparatus of this invention have several features, no single one of which is solely responsible for its desirable attributes. Without limiting the scope of this invention as expressed by the claims which follow, its more prominent features will now be discussed briefly. After considering this brief discussion, and particularly after reading the section entitled "DESCRIPTION OF THE PREFERRED EMBODIMENTS" one will understand how the features of this invention offer its advantages, which include:

(1) The present invention provides a unique and novel process for producing a three-dimensional object on a layer-by-layer basis under the control of a computer. Due to the small powder size and small size of the energy beam induced fusion zone, this process is amenable to the fabrication of a microelectronic device or micro-electromechanical system (MEMS) device containing micron-, submicron-, and/or nanometer-scale functional elements. In contrast to the large droplets ejected by an inkjet printhead, the size of a liquid droplet produced in the presently invented process is essentially controlled by the particle size of the starting powder material. Fine powder particles on a micron and nanometer scale are readily available.

(2) Most of the prior-art layer manufacturing methods, including selected area laser deposition (SALD) and powder-based techniques such as 3-D printing (3DP) and selective laser sintering (SLS), are largely limited to the fabrication of an object with a uniform material composition. Although the prior art SALD method (e.g., as suggested in U.S. Pat. No. 5,017,317) allows for mixing a plurality of gas phases in a chamber and, thereby, forming a composite material part on a target surface through laser-induced chemical vapor deposition, the material compositions of such a composite part could not be spatially controlled. In contrast, the presently invented process readily allows for the fabrication of an object having a spatially controlled material composition comprising two or more distinct types of material. For example, functionally gradient components can be readily fabricated with the present method.

(3) The presently invented method provides a layer-additive process which places minimal constraint on the variety of materials that can be processed. The powder material compositions may be selected from a broad array of materials.

(4) The present invention makes it possible to directly produce net-shaped functional parts of intended materials (not just models or prototypes), thus eliminating intermediate or secondary processing steps such as final sintering or re-impregnation required of 3DP and SLS. This feature enables this new technology to offer dramatic reductions in the time and cost required to realize functional parts.

(5) The method can be embodied using simple and inexpensive mechanisms, so that the fabricator equipment can be relatively small, light, inexpensive and easy to maintain.

DESCRIPTION OF THE PREFERRED EMBODIMENTS

Figure 1:
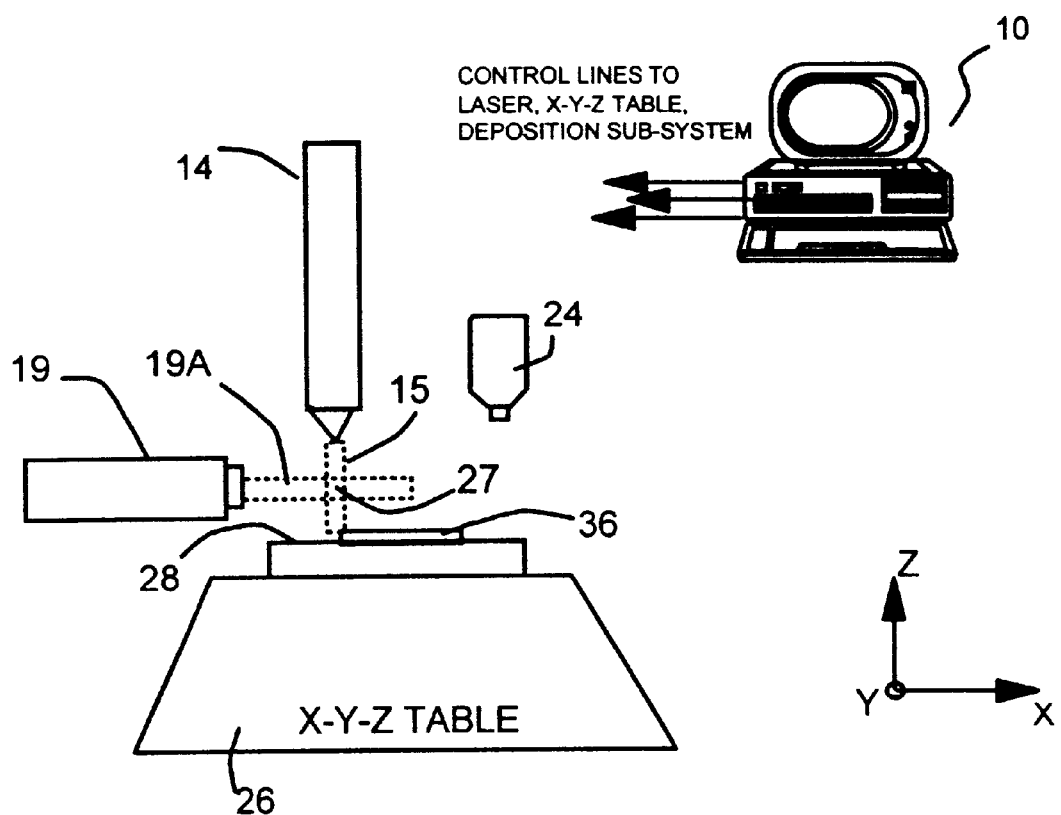
FIG. 1. Schematic of an apparatus for building a 3-D object on a layer-by-layer basis, comprising a multi-channel powder-dispensing device assisted by a laser beam, a target surface capable of moving in an X-Y plane and in an orthogonal Z-axis in a desired sequence, and a computer control system.

In the drawings, like parts have been endowed with the same numerical references.

FIG. 1 illustrates one embodiment of the apparatus of this invention for making three-dimensional objects. This apparatus is equipped with a computer 10 for creating a geometry of an object and, through a hardware controller (including signal generator, amplifier, and other needed functional parts) for controlling the operation of other components of the apparatus. One of these components is a material deposition sub-system which comprises a multiple-channel powder delivery device 14, a directed energy beam such as a laser beam 19A, and an optional separate material dispensing tool 24 for building a support structure when and where needed.

Other components of the apparatus include a target surface 28, optional temperature-regulating means (not shown), pumping and/or gas pressurizing means (not shown) to control the atmosphere of a zone surrounding the target surface where a part 36 is being built, and a three dimensional movement system (e.g., an X-Y-Z gantry table 26) to position the target surface 28 with respect to the material deposition sub-system in a direction on an X-Y plane and in a Z-direction perpendicular to the X-Y plane. The X-Y plane and Z-direction define a Cartesian coordinate system.

The Material Deposition Sub-System

Figure 3:
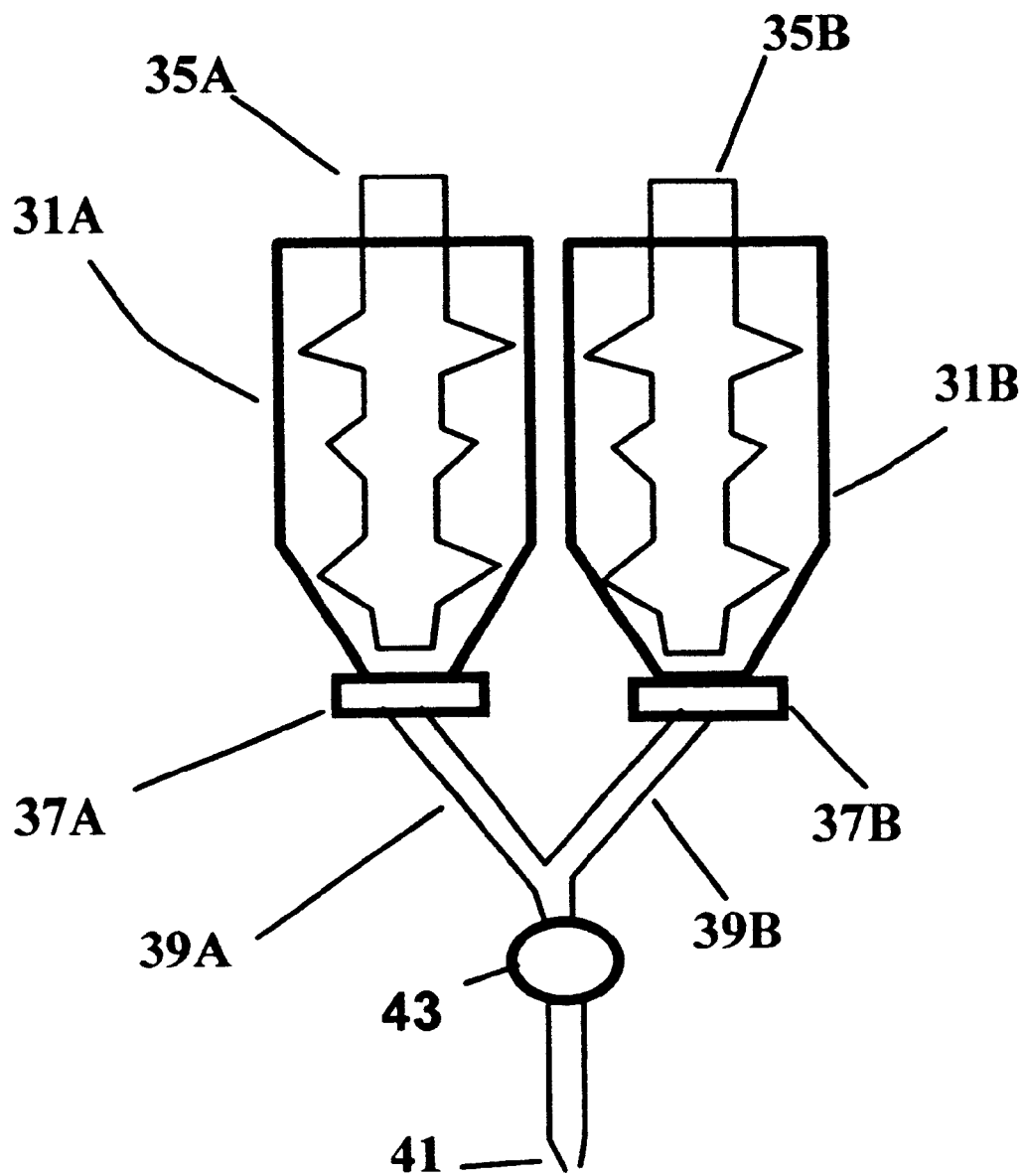
FIG. 3. Schematic of a multi-channel powder delivery system.

FIG. 3 schematically shows a multi-channel powder delivery system which is capable of supplying and dispensing a mixture of different powders at a desired proportion. Only two channels are shown here. The two chambers 31A,31B are used to house different solid powders. An optional stirring device 35A or 35B is used to facilitate feeding of powder particles through valves 37A or 37B. These valves are preferably electronically connected to a machine controller which is regulated by the computer 10. If a valve is turned on, powder particles will flow through a pipe 39A or 39B, enter an optional mixing chamber 43, and be dispensed through an orifice 41. The mixing chamber 43 provides a place where different powders coming from different chambers can be mixed together before they are dispensed. The proportion between powders can be readily varied continuously or intermittently by adjusting, for instance, the opening sizes of the valves 37A, 37B.

Figure 4:
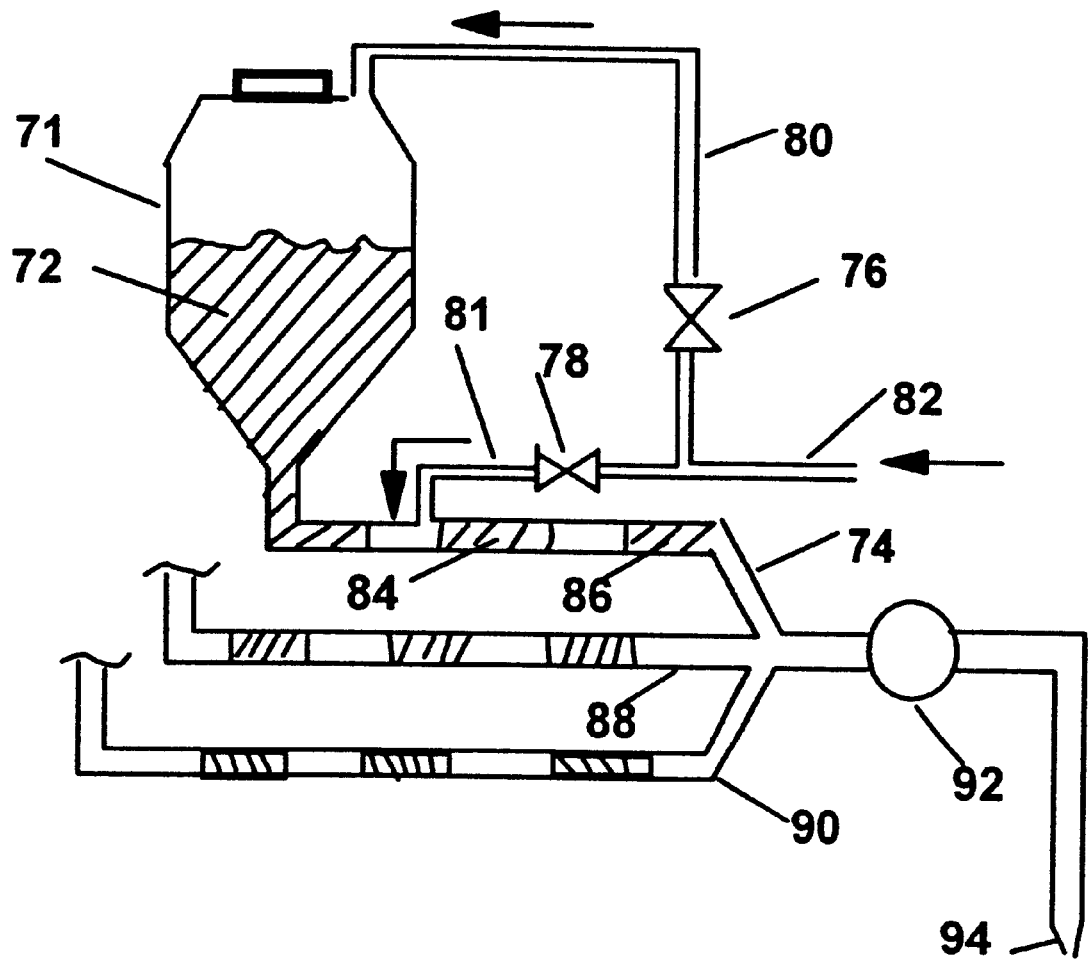
FIG. 4. Another example of a powder delivery system.

FIG. 4 schematically shows another example of a multiple-channel powder delivery device. Only three channels of this pneumatic or air-driven apparatus are shown. This device makes use of the approach known as plug-phase conveying to reduce clogging that frequently occurred to dense-phase conveying. Both approaches are well known in the art of pneumatic powder transportation. In the present device, a container 71 is used to house a powder 72. Compressed air is introduced through pipe 82. Then, through alternating operations of valves 76 and 78, air runs through pipes 80 and 81, respectively, to create and convey forward distinct plugs 84,86 of powder material in first channel 74. Other channels (e.g., 88 and 90) may be similarly equipped with containers, pipes, and valves (not shown) to create and move plugs of different types of powder material. Plugs of materials may be allowed to mix at an optional mixing chamber 92 and then dispensed through an orifice 94 of a nozzle. The present device does not provide a continuous flow of powder because plugs of material are separated by plugs of air. If necessary, however, a continuous flow of powder can be achieved by running two parallel pipelines operating at opposite phases. Plugs of powder can be discharged through the orifice 94. With the present device, by controlling the velocity of plugs throughout each of the material supply systems, different proportions of each material could be combined and deposited. Such a multiple-channel powder delivery device will make it possible to produce parts with spatially tailored material compositions.

Figure 7:
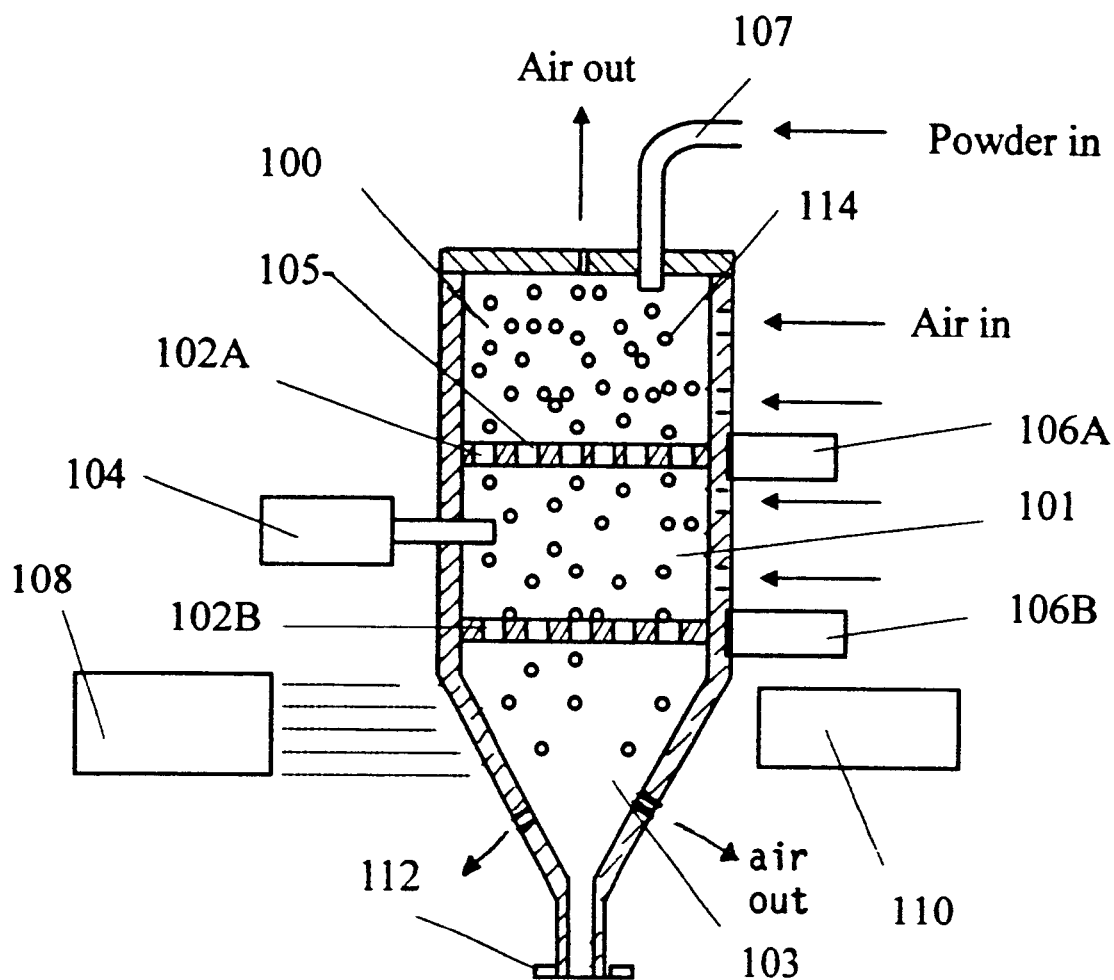
FIG. 7. A cascade of chambers featuring vibration-regulated dynamic sieves and particle counter device can dispense a small number of fine particles at a time for layer manufacturing.

In one preferred embodiment, schematically shown in FIG. 7, a flow channel comprises a plurality of chambers (e.g., 100, 101, 103) separated by dynamic sieves 102A, 102B. Each sieve comprises a plate with two substantially parallel surfaces and sieving holes (e.g., 105) through which powders of selected sizes can filter. The sieves are excited by vibration facilitator (e.g., ultrasonic transducers 106A, 106B, respectively) to undergo vibrational motions at desired frequencies and amplitudes. Vibrational motions can be turned on, when needed, for preventing agglomeration of particles and for facilitating the migration of fine particles through these holes.

Optionally, the chambers may be made into "fluidized beds" by blowing air into a chamber to maintain powder particles (e.g., 114) in a constant motion state inside the chamber to prevent particle aggregation. Preferably, a cascade of at least two or three chambers are stacked together with first chamber 100 being supplied, through the first end 107 of a given channel, with powder particles continuously or intermittently. The cascade of chambers are made to contain decreasing numbers of particles. In other words, the second chamber 101, separated from the first 100 by a dynamic sieve 102A, will have fewer particles as compared with the first chamber. The third chamber 103, separated from the second chamber by a second sieve 102B or valve, is allowed to have a still fewer (but, preferably, predetermined) number of particles at a time.

The last (e.g., the third 103 in this case) of this cascade of chambers is equipped with a particle counting device (e.g., comprising a low-power laser source 108 and a photo detector 110) for counting the number of particles inside this chamber. Preferably, this information is then fed back to a controller for activating the dynamic sieves to replenish the chamber with powder particles. Powder particles may be provided with charges (e.g., negative charges) by a charge injector 104 attached to one of the chambers and the last chamber is provided with an electrode 112 (e.g., positively charged) to direct and/or accelerate the discharge of the powder particles. This chamber assembly makes it possible to provide a few particles (down to a single particle if so desired) at a time through the orifice. This feature now makes it possible to deposit ultra-small domains of selected functional materials in individual layers.

Figure 2:
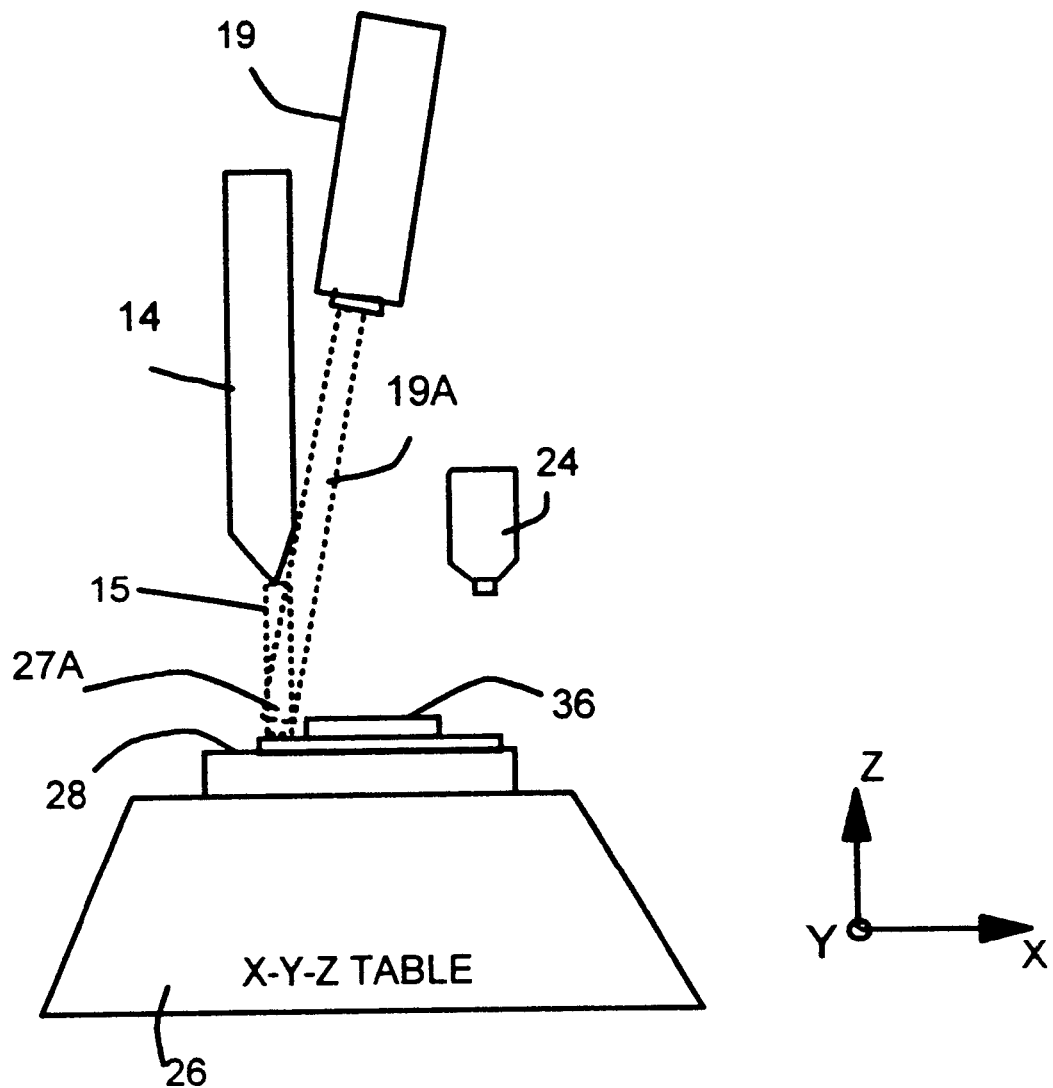
FIG. 2. Schematic of a layer manufacturing apparatus similar to that indicated in FIG. 1, but with the laser beam oriented at a different angle to change the fusion zone size.

The focused energy beam is disposed in working proximity to the target surface and operative to produce a fusion zone near the above-said focused spot for effecting deposition of a material onto the target surface. This energy beam can comprise a laser beam, an electron beam, an ion beam, and/or an induction heated zone produced by an induction generator. Using a laser beam as an example, FIG. 1 and FIG. 2 indicate that the powder flow path and the laser beam intersects to form an interaction zone (hereinafter referred to as a fusion zone 27 and 27A) where the powder particles traveling through are melted to form liquid droplets. These liquid droplets travel to strike a spot of the target surface or of a previous layer and solidify thereon. This deposition spot size is approximately equal to the fusion zone size, which is governed by the powder flow size and the laser beam size whichever being smaller. This feature implies that the deposition spot size, which essentially controls the part accuracy, can be controlled by varying either the laser beam size or the powder flow size. As a special case, the powder may be dispensed one particle at a time and, therefore, the part accuracy can be as good as the particle size. Fine powder particles of metal, ceramic, and polymeric materials are readily available.

The present invention may be utilized to fabricate parts comprising single- or multi-component metals, ceramics, polymers, composites and combinations thereof. The material composition may vary from point to point in a layer or change from layer to layer.

Target Surface

Referring again to FIG. 1, the target surface 28 may be a substrate or platen supported by an X-Y-Z gantry table 26. The substrate can be a polymer, metal, glass, ceramic, composite material, or a combination thereof. The target surface is located in close, working proximity to the dispensing nozzles of the material deposition sub-system. The upper surface of the target surface preferably has a flat region sufficiently large to accommodate the first few layers of the deposited material. The target surface 28 and the material deposition sub-system are equipped with mechanical drive means for moving the target surface relative to the deposition device in three dimensions along the X-, Y-, and Z-axes in a rectangular coordinate system in a predetermined sequence and pattern, and for displacing the deposition sub-system a predetermined incremental distance relative to the target surface. This can be accomplished, for instance as shown in FIG. 1, by allowing the target surface to be driven by an X-Y-Z gantry table while maintaining the deposition sub-system stationary.

Alternatively, the deposition sub-system may be driven by three linear motion devices, which are powered by three stepper motors to provide movements along the X-, Y-, and Z-directions, respectively. Z-axis movements are executed to displace the target surface 28 relative to the material deposition sub-system or to displace the deposition sub-system relative to the target surface and, hence, relative to each layer deposited prior to the start of the formation of each successive layer. In another alternative arrangement, the deposition sub-system may be mounted in a known fashion for movement in the X-Y plane, with the target surface 28 supported for separate movement toward and away from the deposition sub-system along the Z-direction. Alternatively, the work surface may be supported for movement in the X-Y plane, with the deposition sub-system mounted for separate movement along the Z-direction toward and away from the work surface.

Motor means are preferably high resolution reversible stepper motors, although other types of drive motors may be used, including linear motors, servomotors, synchronous motors, D.C. motors, and fluid motors. Mechanical drive means including linear motion devices, motors, and gantry type positioning stages are well known in the art.

These movements will make it possible for the deposition sub-system to deposit and form multiple layers of materials of predetermined thickness, which build up on one another sequentially as the material solidifies after discharge from the orifice to go through the phase change zone.

Heating and cooling means (e.g., heating elements, cooling coils, thermocouple, and temperature controller; not shown) may be provided to a region surrounding the target surface 28 to control the phase change and deposition behavior of the material on the target surface.

Figure 5:
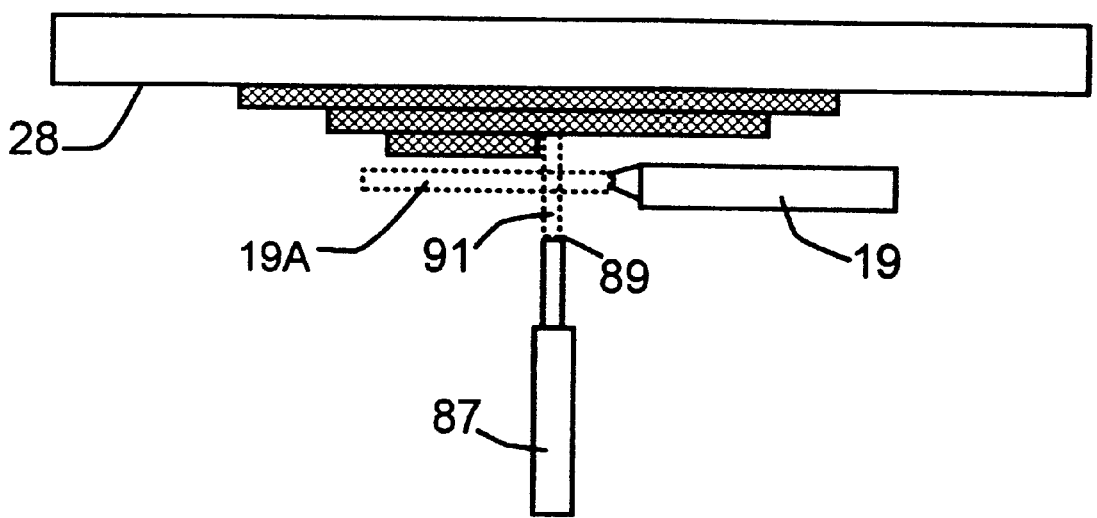
FIG. 5. Schematic drawing of a powder delivery device positioned below a target surface.

In another preferred embodiment of the present invention, as schematically shown in FIG. 5, the material deposition sub-system may be positioned below the bottom surface 28 of a substrate. The powder particles (e.g., from channel 87), after being discharged from an orifice 89, are directed to flow along a generally upward path 91 to strike on the bottom surface 28 (target surface) of a substrate. The focused energy beam 19A could come from an angle of approximately 0 degree up to an angle of approximately 80 degrees. This inverted configuration has the following advantages: Only the desired liquid droplets that are capable of adhering to the target surface or a previous layer are allowed to deposit. The undesired species such as those particles that are un-melted, non-sticking or incompatible would not have an opportunity to be incorporated in the object due to the gravitational force. Instead, they would be allowed to naturally drop downward to a waste collector (not shown), positioned just below the target surface.

Sensor means may be attached to proper spots of the object work surface or the material deposition sub-system to monitor the physical dimensions of the physical layers being deposited. The data obtained are fed back periodically to the computer for re-calculating new layer data. This option provides an opportunity to detect and rectify potential layer variations; such errors may otherwise cumulate during the build process, leading to significant part inaccuracy. Many prior art dimension sensors may be selected for use in the present apparatus.

Mathematical Modeling and Creation of Logical Layers

Figure 6:
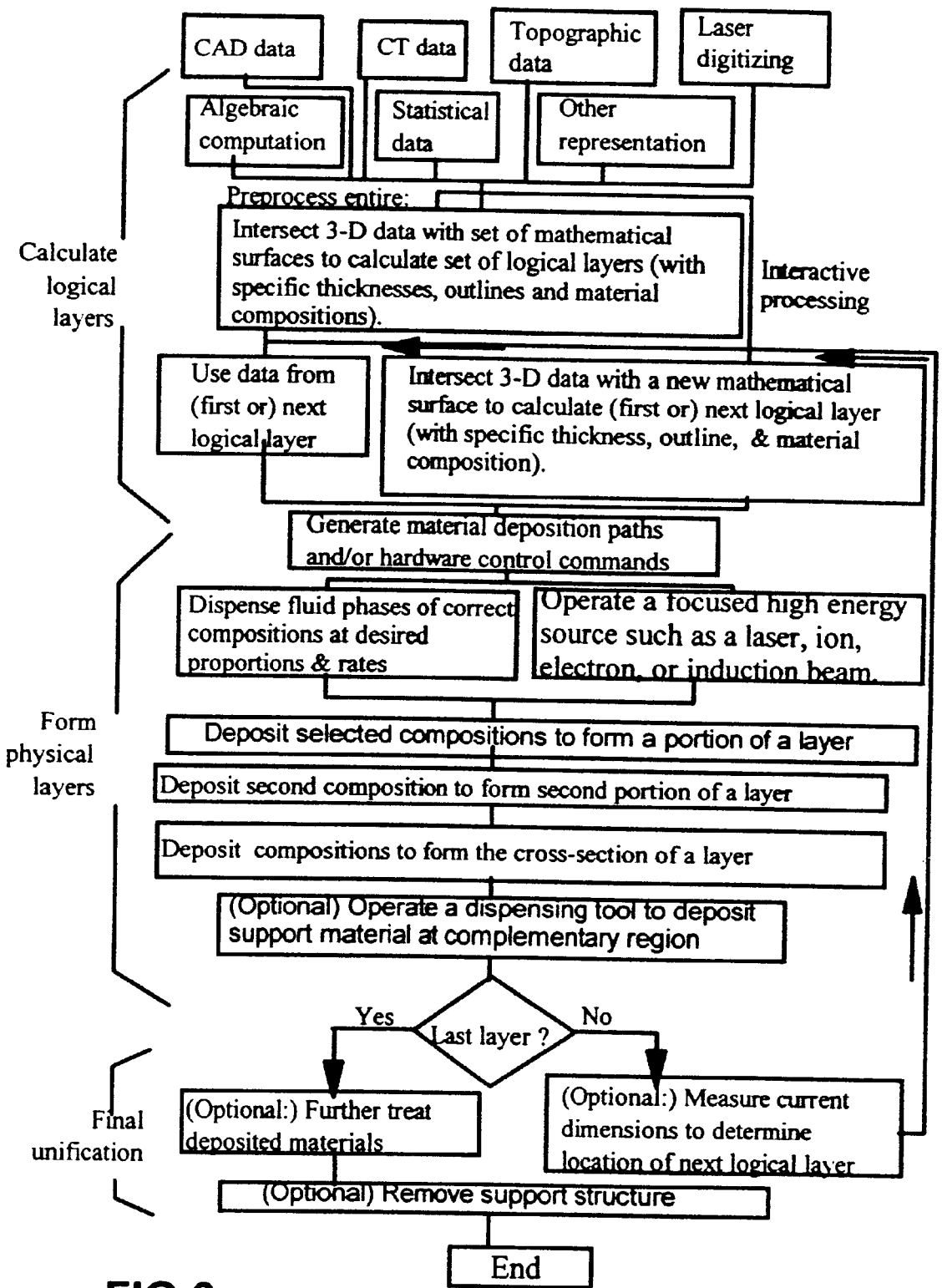
FIG. 6. Flow chart indicating a preferred process that involves using a computer and required software programs for adaptively slicing the image of an object into layer data, for optionally generating data files for support structures, and for controlling various components of the 3-D object building apparatus.

A preferred embodiment of the present invention is a solid freeform fabrication process in which the execution of various steps may be illustrated by the flow chart of FIG. 6. The process begins with the creation of a mathematical model (e.g., via computer-aided design, CAD), which is a data representation of a 3-D object. This model is stored as a set of numerical representations of layers which, together, represent the whole object. A series of data packages, each data package corresponding to the physical dimensions of an individual layer of deposited materials, is stored in the memory of a computer in a logical sequence so that the data packages correspond to individual layers of the materials stacked together to form the object.

Specifically, before the constituent layers of a 3-D object are formed, the geometry of this object is logically divided into a sequence of mutually adjacent theoretical layers, with each theoretical layer defined by a thickness and a set of closed, nonintersecting curves lying in a smooth two-dimensional (2-D) surface. These theoretical layers, which exist only as data packages in the memory of the computer, are referred to as "logical layers." This set of curves forms the "contour" of a logical layer or "cross section". In the simplest situations, each 2-D logical layer is a plane so that each layer is flat, and the thickness is the same throughout any particular layer. However, this is not necessarily so in every case, as a layer may have any desired curvature and the thickness of a layer may be a function of position within its two-dimensional surface. The only constraint on the curvature and thickness function of the logical layers is that the sequence of layers must be logically adjacent. Therefore, in considering two layers that come one after the other in the sequence, the mutually abutting surfaces of the two layers must contact each other at every point, except at such points of one layer where the corresponding point of the other layer is void of material as specified in the object model.

As summarized in the top portion of FIG. 6, the data packages for the logical layers may be created by any of the following methods:

(1) For a 3-D computer-aided design (CAD) model, by logically "slicing" the data representing the model, (2) For topographic data, by directly representing the contours of the terrain, (3) For a geometrical model, by representing successive curves which solve "z=constant" for the desired geometry in an x-y-z rectangular coordinate system, and (4) Other methods appropriate to data obtained by computer tomography (CT), magnetic resonance imaging (MRI), satellite reconnaissance, laser digitizing, line ranging, or other methods of obtaining a computerized representation of a 3-D object.

An alternative to calculating all of the logical layers in advance is to use sensor means to periodically measure the dimensions of the growing object as new layers are formed, and to use the acquired data to help in the determination of where each new logical layer of the object should be, and possibly what the curvature and thickness of each new layer should be. This approach, called "adaptive layer slicing", could result in more accurate final dimensions of the fabricated object because the actual thickness of a sequence of stacked layers may be different from the simple sum of the intended thicknesses of the individual layers.

The closed, nonintersecting curves that are part of the representation of each layer unambiguously divide a smooth two-dimensional surface into two distinct regions. In the present context, a "region" does not mean a single, connected area. Each region may consist of several island-like subregions that do not touch each other. One of these regions is the intersection of the surface with the desired 3-D object, and is called the "positive region" of the layer. The other region is the portion of the surface that does not intersect the desired object, and is called the "negative region." The curves are the boundary between the positive and negative regions, and are called the "outline" of the layer. In the present context, the liquid droplets and the weld pool materials are allowed to be deposited in the "positive region" while a different material may be deposited in certain parts or all of the "negative region" in each layer to serve as a support structure.

As a specific example, the geometry of a three-dimensional object may be converted into a proper format utilizing commercially available CAD or Solid Modeling software. A commonly used format is the stereo lithography file (.STL), which has become a defacto industry standard for layer manufacturing. The object geometry data may be sectioned into multiple layers by a commercially available software program. Each layer has its own shape and dimensions. These layers, each being composed of a plurality of segments, when combined together, will reproduce the complete outline of the intended object. When a variable-composition object is desired, these segments are preferably sorted in accordance with their material compositions. This can be accomplished by taking the following procedure:

When the stereo lithography (.STL) format is utilized, the image is represented by a large number of triangular facets that are connected to simulate the exterior and interior surfaces of the object. The triangles may be so chosen that each triangle covers one and only one material composition. In a conventional .STL file, each triangular facet is represented by three vertex points each having three coordinate points, $(x_1,y_1,z_1)$, $(x_2,y_2,z_2)$, and $(x_3,y_3,z_3)$, and a unit normal vector $(i,j,k)$. Each facet is now further endowed with a material composition code. During the slicing step, neighboring data points with the same composition code on the same layer may be sorted together. These segment data are then converted into programmed signals (data for selecting deposition tools and tool paths) in a proper format, such as the standard NC G-codes commonly used in computerized numerical control (CNC) machinery industry. These layering data signals may be directed to a machine controller which selectively actuates the motors for moving the deposition sub-system with respect to the object target surface, activates signal generators, drive the valve means in the fluid phase delivery device, drives the optional vacuum pump means, and operates optional temperature controllers, etc. It should be noted that although .STL file format has been emphasized in this paragraph, many other file formats have been employed in different commercial rapid prototyping and manufacturing systems. These file formats may be used in the presently invented system and each of the constituent segments for the object image may be assigned a composition code.

The three-dimensional motion controller is electronically linked to the mechanical drive means and is operative to actuate the mechanical drive means in response to "X," "Y," "Z" axis drive signals for each layer received from the CAD computer. Controllers that are capable of driving linear motion devices are commonplace. Examples include those commonly used in a milling machine.

Numerous software programs have become available that are capable of performing the presently specified functions. Suppliers of CAD and Solid Modeling software packages for converting CAD drawings into .STL format include SDRC (Structural Dynamics Research Corp. 2000 Eastman Drive, Milford, Ohio 45150), Cimatron Technologies (3190 Harvester Road, Suite 200, Burlington, Ontario L7N 3N8, Canada), Parametric Technology Corp. (128 Technology Drive, Waltham, Mass. 02154), and Solid Works (150 Baker Ave. Ext., Concord, Mass. 01742). Optional software packages may be utilized to check and repair .STL files which are known to often have gaps, defects, etc. AUTOLISP can be used to convert AUTOCAD drawings into multiple layers of specific patterns and dimensions.

Several software packages specifically written for rapid prototyping have become commercially available. These include (1) SOLIDVIEW RP/MASTER software from Solid Concepts, Inc., Valencia, Calif.; (2) MAGICS RP software from Materialise, Inc., Belgium; and (3) RAPID PROTOTYPING MODULE (RPM) software from Imageware, Ann Arbor, Mich. These packages are capable of accepting, checking, repairing, displaying, and slicing .STL files for use in a solid freeform fabrication system. MAGICS RP is also capable of performing layer slicing and converting object data into directly useful formats such as Common Layer Interface (CLI). A CLI file normally comprises many "polylines" with each polyline being an ordered collection of numerous line segments. These and other software packages (e.g. Bridgeworks from Solid Concepts, Inc.) are also available for identifying an un-supported feature in the object and for generating data files that can be used to build a support structure for the un-supported feature. The support structure may be built by a separate fabrication tool or by the same deposition device that is used to build the object.

A company named CGI (Capture Geometry Inside, currently located at 15161 Technology Drive, Minneapolis, Minn.) provides capabilities of digitizing complete geometry of a three-dimensional object. Digitized data may also be obtained from computed tomography (CT) and magnetic resonance imaging (MRI), etc. These digitizing techniques are known in the art. The digitized data may be re-constructed to form a 3-D model on the computer and then converted to .STL files. Available software packages for computer-aided machining include NC Polaris, Smartcam, Mastercam, and EUCLID MACHINIST from MATRA Datavision (1 Tech Drive, Andover, Mass. 01810).

Formation of the Physical Layers

The data packages are stored in the memory of a computer, which controls the operation of a layer manufacturing system comprising a material deposition subsystem, an object target surface, and motion devices. Using these data packages, the computer controls the manufacturing system to manipulate the fabrication materials to form individual layers of materials in accordance with the specifications of an individual data package. The powder compositions used to form the layer contours have the property that they can be readily fused by a focused energy beam to become liquid droplets at a temperature just slightly above their melting point. These liquid droplets, when striking the target surface or a previous layer on the target surface, readily solidify and adhere thereon.

It may be noted that the powder particles do not have to be completely melted when traveling through the fusion zone. The energy beam power may be adjusted in such a way that only a surface layer of the powder particle is melted with the particle core remaining in the solid state. This surface layer in the liquid state will make it possible for this particle to adhere to a previous layer and/or a neighboring particle when forming a new layer. In some applications (e.g., for the purpose of making a model), it may be advantageous to utilize particles with a surface coating layer having a lower melting point. In this case, a lower-power energy beam can be used to fuse just the surface coating leaving the core powder in the solid state. A lower-power energy beam has the advantages of being lower costs and consuming lesser amount of energy.

A wide range of powder materials can be selected to form a desired object, including various types and combinations of metals, plastics, ceramics, glasses, and composites provided they can be at least partially melted. For powder materials with relatively high melting points, these powders may be preheated before they are allowed to travel through the fusion zone. There is also a great level of flexibility in selecting the surface coating material. The surface coating material can be any type of material or a combination of several types of material compositions provided they have a melting point lower than the melting point of their core counterparts on which they cover. For instance, nylon powders with a melting point of 240° C. may be selected as the coating material if the intended particle core material is copper or silicon dioxide, both having much higher melting temperatures.

As indicated earlier, the fabrication materials do not have to be homogeneous. They may, for example, exhibit variations in composition based upon the structural or physical requirements of the desired object being built. These variations may serve to accomplish internal variations of the physical properties of the object, such as conductivity, hardness, mass density, and coefficient of thermal expansion and variations of external appearance such as color patterns. In one preferred embodiment, the powder compositions may be deposited to comprise a spatially controlled material composition comprising two or more distinct types of materials. In a further specific embodiment, the materials may be deposited in continuously varying concentrations of distinct types of materials. These material composition variations can be readily accomplished by operating the presently discussed multiple-channel powder delivery device.

If material composition variation is desired within any particular layer, and if the mechanism (e.g., in FIG. 3 and FIG. 4) for depositing the fabrication material has the capability of depositing the required various compositions automatically, then the variation in composition may be represented mathematically within the data package for each layer, and the mathematical representation may be used to control the composition of materials deposited. However, if the mechanism for depositing a material is limited to providing layers of any one specific composition at a time, then variations in composition may be accomplished by logically separating a particular layer into sub-layers, where each sub-layer is composed of a different material, and the union of the sub-layers is equal to the particular layer. Each sub-layer is then treated as a distinct layer in the deposition process, and the complete layer is formed by the formation and bonding of a succession of its constituent sub-layers. If the interface between sub-layers is along surfaces perpendicular to the layers, and not along surfaces parallel to the layers, then the bonding of each sub-layer is not to the previous sub-layer, but to the previous complete layer.

As another embodiment of the present invention, therefore, a solid freeform fabrication process may comprise the steps of (1) positioning a material deposition sub-system a selected distance from a target surface; (2) operating this sub-system to deposit materials onto the target surface; and (3) during this material deposition process, moving the deposition sub-system and the work surface relative to one another in a plane defined by first and second directions (X- and Y-directions) and in a third direction (Z-) orthogonal to the X-Y plane to form a three-dimensional shape. The deposition step (2) comprises the steps of (a) operating a multiple-channel powder delivery device for supplying multiple powder compositions, flowing toward selected spots of the target surface and (b) operating a focused energy beam to produce a fusion zone proximate the target surface in such a fashion that the powder particles traveling through this fusion zone are melted during flight to form liquid droplets. These liquid droplets continue their movement until striking the selected spots. These two steps, (a) and (b), may be carried out in a predetermined sequence. Preferably, materials of predetermined compositions are deposited point by point and/or layer by layer; material composition may vary from point to point and/or from layer to layer.

Specifically, the above-cited moving step (3) preferably includes the sub-steps of (i) moving the material deposition sub-system and target surface relative to one another in a direction parallel to the X-Y plane to form a first layer of the materials on the target surface; (ii) moving the deposition sub-system and the work surface away from each other by a predetermined layer thickness; and (iii) depositing a second layer of the materials onto the first layer while simultaneously moving the work surface and the deposition sub-system relative to one another in a direction parallel to the X-Y plane, whereby the second layer solidifies and adheres to the first layer.

Preferably, the process further comprises additional steps of forming multiple layers of the materials on top of one another by repeated depositing of materials from the fusion zone as the target surface and the deposition sub-system are moved relative to one another in a direction parallel to the X-Y plane, with the deposition sub-system and the target surface being moved away from one another in the Z-direction by a predetermined layer thickness after each preceding layer has been formed, and with the depositing of each successive layer being controlled to take place after the material in the preceding layer immediately adjacent the nozzle has substantially solidified. These steps can be accomplished by operating the apparatus described above either manually or, preferably, under the control of a computer system.

Therefore, another preferred embodiment is a process as set forth in the above three steps, (1) through (3) plus (a) and (b), further comprising the steps of (4) creating a geometry of the 3-D object on a computer with the geometry including a plurality of segments defining the object; (5) generating programmed signals corresponding to each of these segments in a predetermined sequence; and (6) moving the deposition sub-system and the target surface relative to one another in response to the programmed signals. These additional steps provide computerized control over the relative motions between the deposition sub-system and the target surface to build a 3-D object. However, the material composition distribution pattern of an object is not necessarily predetermined. The adjustments of compositions for different portions of an object can be made at any time during the object building process or in a random fashion, if so desired.

If a predetermined material distribution pattern is desired before the object building process begins, then this pattern may be defined by attaching a material composition code to each of the constituent segments defining the object. When the computer reads a specific code, during the object building process, it will send out proper control signals to select the correct channels for dispensing powder materials of selected compositions into the fusion zone. Therefore, another embodiment of the present invention is a process as set forth in the above three steps, (1) through (3), but further comprising the steps of (c) creating a geometry of the object on a computer with the geometry including a plurality of segments defining the object and with each of the segments being coded with a material composition defined by the operation of a specific set of selected powder delivery channels; (d) generating programmed signals corresponding to each of these segments in a predetermined sequence; (e) operating the pulse generator (actuator means) in response to the programmed signals to activate selected channels; and (f) moving the deposition sub-system and the target surface relative to one another in response to the programmed signals.

As indicated earlier, the most popular file format used by all commercial rapid prototyping machines is the .STL format. The .STL file format describes a CAD model's surface topology as a single surface represented by triangular facets. By slicing through the CAD model simulated by these triangles, one would obtain coordinate points that define the boundaries of each cross section. It is therefore convenient for a dispensing nozzle to follow these coordinate points to trace out the perimeters of a layer cross section. These perimeters may be built with a proper material composition pattern to form an outer boundary of the object. The outer boundary demarcates a positive region (to be filled by materials as a part of a layer) from a negative region.

In one preferred embodiment, the negative region of a layer may be partially or fully filled with an inert material (preferably by using a separate deposition tool) before beginning to build a subsequent layer. This inert material may just serve as a support structure or as a protective structure. In a multi-layer microelectronic device, this inert material may be an electrically insulating material such as an epoxy or polyimide resin. This deposition tool can be just an extrusion device, a sprayer, an inkjet printhead, etc. These tools are commonly used in other layer manufacturing processes.

This outer boundary also defines an interior space in the object. Hence, the moving step may further include the step of moving the deposition sub-system and the target surface relative to one another in selected directions parallel to the X-Y plane according to at least one other predetermined pattern to fill this interior space with selected materials. The interior does not have to have the same material composition as the exterior boundary. The interior space may be built with materials of a spatially controlled composition comprising one or more distinct types of materials. The materials may be deposited in continuously varying concentrations of distinct types of materials. This process may further comprise the steps of (g) creating a geometry of the object on a computer with the geometry including a plurality of segments defining the object; and (h) generating program signals corresponding to each of these segments in a predetermined sequence, wherein the program signals determine the movement of the deposition sub-system and the work surface relative to one another in the first predetermined pattern and at least one other predetermined pattern.

The above procedures of delineating a boundary of a cross section and filling in the interior space of the cross section may be automated by using a computer system. This can be achieved by taking the following steps: (j) creating a geometry of the object on a computer with the geometry including a plurality of segments defining the object; (k) generating program signals corresponding to each of the segments in a predetermined sequence; (l) activating at least one powder delivery channel to dispense selected deposition materials; and (m) during this dispensing step, moving the deposition sub-system and the object target surface in response to the programmed signals relative to one another in the X-Y plane and in the Z-direction in a predetermined sequence of movements such that the deposition materials are dispensed in free space as a plurality of segments sequentially formed so that the last dispensed segment overlies at least a portion of the preceding segment in contact therewith to thereby form the object.

As another preferred embodiment, a layer manufacturing process comprises the steps of (A) creating a geometry of a 3-D object on a computer with the geometry including a plurality of segments defining this object and each segment being coded with a material composition; (B) evaluating the data files representing the object to locate any unsupported feature of the object, which is followed by determining a support structure for the un-supported feature and creating a plurality of segments defining the support structure; (C) generating program signals corresponding to each of these constituent segments for both the object being built and the support structure in a predetermined sequence; (D) providing at least one material composition for the object and one composition for the support structure; (E) feeding desired powder compositions to selected deposition channels and directing the powder particles to travel toward selected spots of the target surface; (F) operating a focused energy beam to produce a fusion zone proximate the target surface for melting those powder particles traveling through this fusion zone, allowing the fused particles (liquid droplets) to strike selected spots; (G) operating a dispensing tool (a separate dispenser or the same deposition device) to deposit a support structure material; (H) during these material deposition steps, (E), (F) and (G), moving the deposition sub-system and the work surface in response to the programmed signals relative to one another in the X-Y plane and in the Z-direction in a predetermined sequence of movements such that the materials are deposited in free space as a plurality of segments sequentially formed so that the last dispensed segment overlies at least a portion of the preceding segment in contact therewith to thereby form the support structure and the three-dimensional object.

The presently invented process and apparatus makes it possible to cost-effectively produce single-layer or multi-layer printed-circuit boards or micro-electronic devices. For instance, electrically conductive copper paths on the micron or sub-micron scale can be readily deposited onto an insulating substrate such as a fiberglass composite or silicon substrate. Resistor, capacitor, inductor and many other functional materials of various compositions also can be readily deposited. If necessary, upon completion of a layer or a part of a layer, discrete devices such as a diode or transistor can be mounted to selected spots on a layer to complete a circuit. These procedures can be repeated for building a multi-layer microelectronic device or micro electro-mechanic system (MEMS).

What is claimed:

1. Solid freeform fabrication apparatus for making a three-dimensional object, comprising:
   (a) a target surface;
   (b) a material deposition sub-system, disposed in working proximity to said target surface, comprising:
      a powder delivery device comprising (1) a multiplicity of flow channels with each channel having first and second ends, said first end being supplied with particles of a fine powder composition and said second end having a discharge orifice of a predetermined size to dispense said powder composition therethrough, and (2) valve means located in control relation to each of said channels for regulating the flow of said powder particles through said discharge orifice toward said target surface; the flow of said dispensed powder particles forming a travel path;
      a focused energy beam disposed in working proximity to said target surface and operative to intersect said powder travel path for producing a fusion zone in which said powder particles are at least partially melted to form liquid droplets, said liquid droplets continuing to travel along said path for deposition onto said target surface;
   (c) motion devices coupled to said target surface and said material deposition sub-system for moving said deposition sub-system and said target surface relative to one another along selected directions in a plane defined by first and second coordinate directions and in a third coordinate direction orthogonal to said plane to form said deposition materials into a three-dimensional shape.

2. Apparatus as set forth in claim 1, wherein said focused energy beam comprises a laser beam.

3. Apparatus as set forth in claim 1, further comprising:
   a computer-aided design computer and supporting software programs operative to create a three-dimensional geometry of a desired object, to convert said geometry into a plurality of segments defining the object, and to generate programmed signals corresponding to each of said segments in a predetermined sequence; and
   a three-dimensional machine controller electronically linked to said computer and said motion devices and operative to drive said motion devices in response to said programmed signals for each of said segments received from said computer.

4. Apparatus as set forth in claim 3 wherein said machine controller and said computer comprise means for controlling said valve means for regulating the flow of said powder compositions.

5. Apparatus as set forth in claim 3, wherein said material deposition sub-system further comprises a separate material dispensing tool and said supporting software programs comprise:
   means for evaluating the data files representing the geometry of said object to locate any un-supported feature of the object;
   means, responsive to the evaluating means locating an un-supported feature, for defining a support structure for said un-supported feature;
   means for creating a plurality of segments defining said support structure; and
   means for generating programmed signals required by said separate material dispensing tool to fabricate said support structure.

6. Apparatus as set forth in claim 3, further comprising:
   sensor means electronically linked to said computer and operative to periodically provide layer dimension data to said computer;
   supporting software programs in said computer operative to perform adaptive layer slicing to periodically create a new set of layer data comprising segments defining the object in accordance with said layer dimension data acquired by said sensor means, and to generate programmed signals corresponding to each of said segments in a predetermined sequence.

7. Apparatus as set forth in claim 1 wherein said powder delivery device further comprises a ventilation system for removing unused powder particles proximate or on said target surfaces.

8. Apparatus as set forth in claim 1 wherein said powder delivery device is positioned below said target surface in such a fashion that the material deposition takes place approximately upwardly from underneath said target surface.

9. Apparatus as set forth in claim 1, wherein said focused energy beam comprises an ion beam.

10. Apparatus as set forth in claim 1, wherein said focused energy beam comprises an electron beam.

11. Apparatus as set forth in claim 1, wherein said focused energy beam comprises a focused induction heating zone.

12. Apparatus as set forth in claim 1, wherein at least one of said channels comprises a dynamic powder sieving and dispensing device comprising:
   first chamber in flow communication with said first end of said channel to receive fine powder particles therefrom,
   first sieve means with first and second surfaces substantially parallel to each other, said first surface in flow communication with said first chamber; said sieve means being equipped with a vibration facilitator; and
   second chamber having proximal and distal ends, said proximal end in flow communication with said second surface of said first sieve means and said distal end in flow communication with said discharge orifice.

13. Apparatus as set forth in claim 12, wherein said second chamber is further equipped with a particle counting device.

14. Apparatus as set forth in claim 12, further comprising:
   a charge injector in flow communication with at least one of said chambers for making powder particles therein electrostatically charged, and
   an electrode disposed in working proximity to said discharge orifice to direct the flow of said charged particles.

15. Apparatus as set forth in claim 1, wherein at least one of said channels comprises a dynamic powder sieving and dispensing device comprising:
   first chamber in flow communication with said first end of said channel to receive fine powder particles therefrom,
   first sieve means with first and second surfaces substantially parallel to each other, said first surface in flow communication with said first chamber; said sieve means being equipped with a vibration facilitator,
   second chamber having proximal and distal ends, said proximal end in flow communication with said second surface of said first sieve means; said second chamber being equipped with a particle counting device, valve means in control relation with said distal end of said second chamber and in flow communication with said discharge orifice.

16. Apparatus as set forth in claim 15, further comprising:

a charge injector in flow communication with at least one of said chambers for making powder particles therein electrostatically charged, and an electrode disposed in working proximity to said discharge orifice to direct the flow of said charged particles.

17. A freeform fabrication process for making a three-dimensional object, said process comprising the steps of:

positioning a material deposition sub-system a selected distance from a target surface;

operating said sub-system, comprising a multiple-channel powder delivery device and a focused energy beam, to deposit selected materials onto said target surface comprising the sub-steps of (a) operating said powder delivery device for ejecting powder particles of selected material compositions traveling along a path toward said target surface; (b) operating said energy beam to intersect said powder travel path for producing a fusion zone in which said particles are at least partially melted during travel, forming liquid droplets that travel to deposit onto said target surface;

during said material deposition process, moving said deposition sub-system and said target surface relative to one another along selected directions in a plane defined by first and second coordinate directions and in a third coordinate direction orthogonal to said plane to form deposition materials into a three dimensional shape.

18. A process as set forth in claim 17, wherein the moving step includes the sub-steps of:

(a) moving said deposition sub-system and said target surface relative to one another in a direction parallel to said plane to deposit a first portion of a first layer from first powder composition onto said target surface;

(b) moving said deposition sub-system and said target surface relative to one another in a direction parallel to said plane to form a second portion of said first layer from a second powder composition onto said target surface;

(c) repeating step (b) for completing the deposition of predetermined materials for said first layer;

(d) moving said material deposition sub-system and said target surface away from one another in said third direction by a predetermined layer thickness; and (e) dispensing and depositing a second layer of predetermined materials from a second set of powder compositions onto said first layer while simultaneously moving said target surface and said deposition sub-system relative to one another in selected directions parallel to said plane, whereby said second layer adheres to said first layer.

19. A process as set forth in claim 18, comprising additional steps of forming multiple layers of said deposition materials on top of one another by repeated dispensing and depositing of said deposition materials from said deposition sub-system as said target surface and said deposition sub-system are moved relative to one another in a direction parallel to said plane, with said deposition sub-system and said target surface being moved away from one another in said third direction by a predetermined layer thickness after each preceding layer has been formed.

20. A process as set forth in claim 17, further comprising the steps of:

creating a geometry of said three-dimensional object on a computer with said geometry including a plurality of segments defining the object;

generating programmed signals corresponding to each of said segments in a predetermined sequence; and moving said deposition sub-system and said target surface relative to each other in response to said programmed signals.

21. A process as set forth in claim 17, further comprising the steps of:

creating a geometry of said three-dimensional object on a computer with said geometry including a plurality of segments defining the object; each of said segments being coded with a selected material composition corresponding to one or more of said powder compositions combined at a predetermined proportion;

generating programmed signals corresponding to each of said segments in a predetermined sequence;

operating said material deposition sub-system in response to said programmed signals to selectively dispense and deposit said selected deposition materials;

moving said deposition sub-system and said target surface relative to one another in response to said programmed signals.

22. A process as set forth in claim 17, wherein said moving step includes the step of moving said deposition sub-system and said target surface relative to one another in selected directions parallel to said plane according to a first predetermined pattern to form an outer boundary from selected powder compositions on said target surface, said outer boundary defining an exterior surface of said object.

23. A process as set forth in claim 22, wherein said outer boundary defines an interior space in said object, and said moving step further includes the step of moving said deposition sub-system and said target surface relative to one another in selected directions parallel to said plane according to at least one other predetermined pattern to fill said interior space with selected deposition materials.

24. A process as set forth in claim 23, further comprising the steps of:

creating a geometry of said three-dimensional object on a computer, said geometry including a plurality of segments defining said object; and generating program signals corresponding to each of said segments in a predetermined sequence, wherein said program signals determine said movement of said deposition sub-system and said target surface relative to one another in said first predetermined pattern and said at least one other predetermined pattern.

25. A process as set forth in claim 23 wherein said interior space is deposited with a spatially controlled material composition comprising two or more distinct types of materials.

26. A process as set forth in claim 25 wherein said interior space is deposited with a material composition in continuously varying concentrations of distinct materials in three-dimensional part space to form a spatially controlled material composition part.

27. A process as set forth in claim 25 wherein said distinct types of materials are deposited at discrete locations in three-dimensional part space to form a spatially controlled material composition part.

28. A process as set forth in claim 17, further comprising:
using dimension sensor means to periodically measure dimensions of the object being built;
using a computer to determine the thickness and outline of individual layers of said deposition materials in accordance with a computer aided design representation of said object; said computing step comprising operating said computer to calculate a first set of logical layers with specific thickness and outline for each layer and then periodically re-calculate another set of logical layers after periodically comparing the dimension data acquired by said sensor means with said computer aided design representation in an adaptive manner.

29. A process as set forth in claim 17, wherein said operation of a deposition sub-system includes the operation of a separate material dispensing tool and wherein said process further comprises the steps of:
creating a geometry of said three-dimensional object on a computer with said geometry including a plurality of segments defining the object;
evaluating the data files representing said object to locate any un-supported feature of the object and, responsive to said evaluation step, determining a support structure for the un-supported feature and creating a plurality of segments defining said support structure;
generating program signals corresponding to each of said segments for both said object and said support structure in a predetermined sequence;
moving said deposition sub-system and said work surface relative to each other in response to said programmed signals for said material deposition sub-system to build said object and said support structure.

30. A process as set forth in claim 17, wherein said operation of a deposition sub-system includes the operation of a separate material dispensing tool and wherein said process further comprises the steps of:
creating a geometry of said three-dimensional object on a computer with said geometry including a plurality of segments defining the object;
evaluating the data files representing said object to locate any un-supported feature of the object and, responsive to said evaluation step, determining a support structure for the un-supported feature and creating a plurality of segments defining said support structure; each of said segments for the object and the support structure being coded with a selected material composition;
generating programmed signals corresponding to each of said segments in a predetermined sequence;
operating said material deposition sub-system in response to said programmed signals to selectively dispense and deposit said selected deposition materials; and
moving said deposition sub-system and said target surface relative to one another in response to said programmed signals for building said object and said support structure.

31. A process as set forth in claim 17, wherein said powder delivery device is positioned below said target surface so that the deposition of materials takes place generally upwardly from underneath.

32. Process as set forth in claim 17, wherein said powder particles comprising solid particles surface-coated with a lower melting point material.

33. A freeform fabrication process for making a three-dimensional object, said process comprising the steps of:
(1) positioning a material deposition sub-system a selected distance from a target surface; said deposition sub-system comprising a multiple-channel powder delivery device and a focused energy beam;
(2) operating said deposition sub-system to deposit selected materials onto said target surface comprising the sub-steps of (a) operating said powder delivery device for directing first powder composition toward a first area of said target surface; (b) operating said focused energy beam to produce a fusion zone near said first area for melting said powder to form liquid droplets traveling to deposit a first portion of said object onto said target surface; (c) moving said deposition sub-system and said target surface relative to one another along selected directions in a plane defined by first and second coordinate directions and, during said moving step, operating said deposition sub-system to deposit a second portion of said first layer onto said target surface; (d) repeating steps (a), (b) and (c) to complete the deposition of a cross-section of materials for said first layer of the object, the boundary of said cross-section defining a complementary un-deposited region;
(3) operating a dispensing tool to deposit a support material to at least a portion of said complementary region;
(4) moving said deposition sub-system and said target surface away from one another by a predetermined layer thickness in a third direction orthogonal to said plane; and
(5) repeating the above operating and moving steps (2), (3) and (4) to form multiple layers of deposition materials, one adhering upon another, into a three dimensional shape.

34. A process as set forth in claim 33, further comprising the step of removing at least a portion of said support material following the completion of one of said multiple layers.

35. A process as set forth in claim 33, wherein said operating and moving steps are controlled by a computer.

* * * * *